United States Patent
Boehm

(10) Patent No.: US 6,958,724 B2
(45) Date of Patent: Oct. 25, 2005

(54) METHOD AND CIRCUIT FOR CONFORMING AN ANALOG ACTUAL SIGNAL TO A DIGITAL DESIRED SIGNAL

(75) Inventor: Heinrich-Martin Boehm, Unterschleissheim (DE)

(73) Assignee: EADS Deutschland GmbH, Ottobrunn (DE)

(*) Notice: Subject to any disclaimer, the term of this patent is extended or adjusted under 35 U.S.C. 154(b) by 0 days.

(21) Appl. No.: 10/764,489

(22) Filed: Jan. 27, 2004

(65) Prior Publication Data

US 2004/0239547 A1 Dec. 2, 2004

(30) Foreign Application Priority Data

Jan. 29, 2003 (DE) ........................................ 103 03 347

(51) Int. Cl.$^7$ ............................................... H03M 1/46
(52) U.S. Cl. ........................................ 341/162; 341/155
(58) Field of Search ............................... 341/161, 162, 341/163, 165

(56) References Cited

U.S. PATENT DOCUMENTS

| | | | |
|---|---|---|---|
| 4,768,109 A | * | 8/1988 | Matsuo .......................... 386/44 |
| 4,831,382 A | * | 5/1989 | Debus, Jr. et al. ........... 341/200 |
| 5,028,927 A | | 7/1991 | Sugiura et al. |
| 5,057,841 A | | 10/1991 | Veerhoek et al. |
| 5,392,074 A | * | 2/1995 | Watanabe et al. ............ 348/647 |
| 5,515,050 A | * | 5/1996 | Luedtke ....................... 341/163 |
| 6,351,231 B1 | * | 2/2002 | Price et al. ................... 341/155 |
| 6,380,881 B2 | * | 4/2002 | Harada et al. ................ 341/165 |
| 6,434,202 B1 | * | 8/2002 | Saur ............................. 375/297 |
| 6,608,582 B2 | * | 8/2003 | Casper et al. ................ 341/155 |
| 2001/0038352 A1 | * | 11/2001 | Bardelli et al. .............. 341/163 |

FOREIGN PATENT DOCUMENTS

DE      101 39 488 C1     8/2001

* cited by examiner

*Primary Examiner*—Howard L. Williams
(74) *Attorney, Agent, or Firm*—Crowell & Moring LLP

(57) ABSTRACT

A method of controlling an analog actual signal to conform to a digital desired signal uses a comparator with two input ports and one output port and a digital-to-analog converter. The analog actual signal to be converted is fed to one input port of the comparator and a analog output signal of the digital-to-analog converter is fed to the other input port of the comparator. The digital input signal fed to the digital-to-analog converter is adapted as a function of the output signal of the comparator in a definable number of iterative steps, between a definable lower and a definable upper threshold, according to the balancing method. The digital input signal fed to the digital-to-analog converter corresponds to the digital desired signal to which the analog actual signal is converted.

4 Claims, 2 Drawing Sheets

METHOD AND CIRCUIT FOR CONFORMING AN ANALOG ACTUAL SIGNAL TO A DIGITAL DESIRED SIGNAL

BACKGROUND AND SUMMARY OF THE INVENTION

This application claims the priority of German patent document 103 03 347.5, filed Jan. 29, 2003, the disclosure of which is expressly incorporated by reference herein.

The invention relates to a method and to a circuit for changing an analog actual signal to a digital desired signal.

RF systems are known which have RF (radio frequency) amplifiers as detectors (e.g., rf detectors or current sensors) for monitoring the transmitting and receiving operation. In this case, a detected video signal is an image of received rf pulses, which are monitored by analog comparators and compared with a reference threshold. The output of these comparators is analyzed, and the result is normally forwarded by way of serial interfaces for further processing.

Referring to FIG. 1, the (normally programmable) analog comparator K generates the reference threshold (the analog desired signal $AS_S$) internally by means of an installed digital-to-analog converter D/A. The corresponding digital values $DS_S$ for the analog desired signal $AS_S$ are stored in a known storage medium SP, such as an EPROM and, depending on the operating mode of the comparator K, are written into the corresponding comparator input 1. The analog actual signal $S_I$ is fed to the other comparator input 2. At the comparator output A, it can be determined whether the actual signal $S_I$ is larger or smaller than the desired signal $AS_S$ (FIG. 1).

For calibrating the detectors, the rf power to be monitored is measured, for example, by means of an RF power meter (the so-called Peak Power Analyzer). Simultaneously, for the same rf pulse, the detected voltage must be measured at the detector, normally by means of an oscilloscope, at the output pin of the respective comparator.

The high construction cost and time expenditures required for the measuring operation at the comparator output as described above are disadvantageous. Normally, no test pins or external plug connections are available at the output of the comparator, because this requires considerable additional expenditures during the production. Thus, for testing purposes, the entire apparatus must be reconstructed (for example, opened) in order to detect the actual signal at the comparator input. This creates measuring uncertainties because of tolerances at the measuring point in time by means of the oscilloscope, and measuring faults as a result of, for example, coupled-in interferences which falsify the actual signal. These measuring uncertainties therefore lead to disadvantages during the calibration of the detectors.

Other disadvantages result from the fact that certain detectors may have to be calibrated at different temperatures and thus in climatic test chambers, making the adaptation of the test signals more difficult.

It is an object of the invention to provide a simple, rapid, substantially automatic method for changing an analog actual signal to a digital desired signal.

Another object of the invention is to provide such a method, by which an adaptive calibration of detectors becomes possible.

Still another object of the invention is to provide a circuit for implementing the method.

These and other objects and advantages are achieved by the method and apparatus according to the invention, in which the digital input signal fed to the digital/analog converter is adapted as a function of the output signal of the comparator present at the comparator output in a definable number of iterative steps (between definable lower and upper thresholds) according to a balancing method. The digital input signal fed to the digital/analog converter corresponds to the digital desired signal to which the analog actual signal is conformed.

Other objects, advantages and novel features of the present invention will become apparent from the following detailed description of the invention when considered in conjunction with the accompanying drawings.

DETAILED DESCRIPTION OF THE DRAWINGS

In the method according to the invention, a reference threshold is prepared in a binary manner, as a function of the number of definable iterative steps, which advantageously corresponds to the bit length by which the digital desired signal is to be indicated. With a large number of iterative steps, the precision of the desired signal and of the reference threshold can therefore be indicated. Thus, in the case of eight iterative steps, the analog actual signal is simulated by an eight-bit resolution. In this case, the simulation takes place bit by bit according to the well known balancing method, in which the voltage present at the comparator is successively approximated in several steps. In digital technology, such a method is known for the implementation of A/D and/or D/A converters, in addition to the parallel method and the counting method.

The method according to the invention eliminates the need for the test by means of an oscilloscope and its external adaptation. Additional time-intensive and cost-intensive reconstructing measures are also eliminated, and the calibration can be carried out simply and rapidly without reconstruction in a climatic test chamber.

Figure 3:
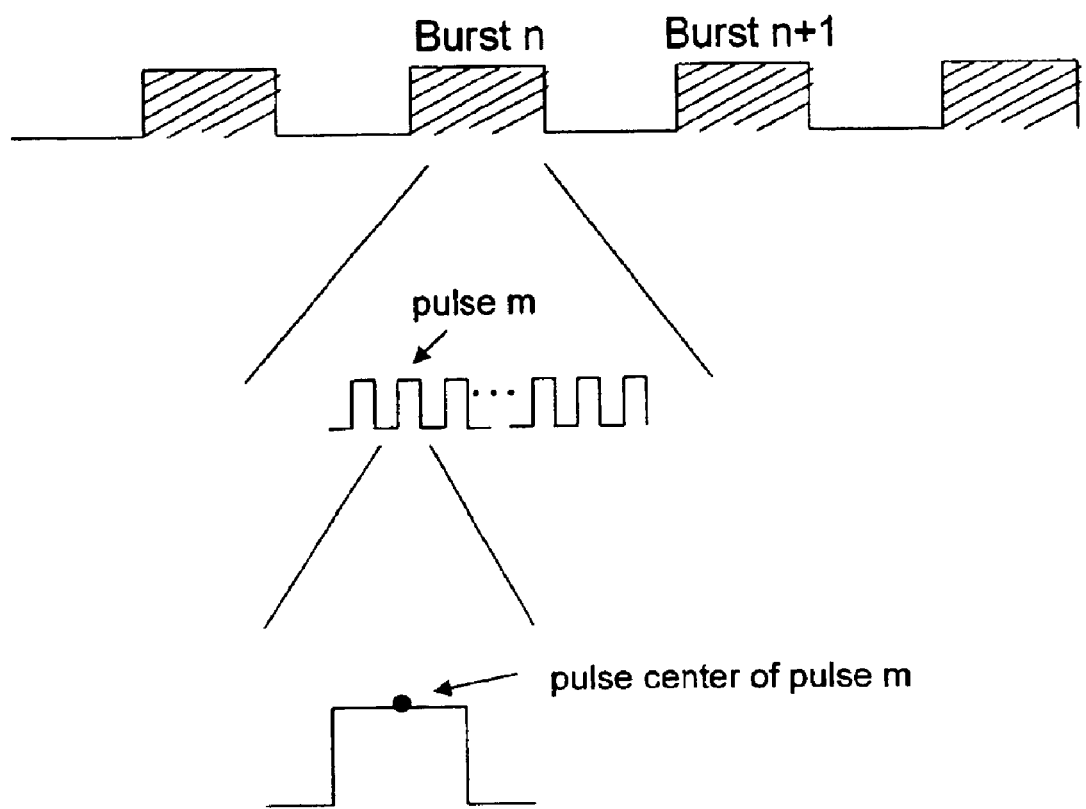
FIG. 3 is a schematic depiction of input pulse burst which make up the analog actual signal.

In an advantageous embodiment of the invention, the analog actual signal comprises a burst (pulse train) with several pulses having a definable pulse duration. The pulse duration may, for example, be in the range of only a few $\mu$sec. A burst may comprise any arbitrary number of pulses (for example 268), as shown schematically in FIG. 3 of the drawing.

As a result of the successive pulses, for example, in the case of RF power transistors, a change of the actual signal may take place during the burst (a so-called burst droop) due to heating. During measurements, it was surprisingly found that, during the regular sending of bursts, the same conditions (constant actual value) always occur for the same pulses in the burst. In a further advantageous embodiment of the invention, the actual signal at the comparator is considered for a preselectable pulse m from the burst. Furthermore, on the basis of the preselected pulse m, the signal value corresponding to the pulse center is advantageously processed in the comparator. (See FIG. 3.)

Thus, during the continuous operation of, for example, burst n to burst n+8 at pulse m, the analog actual value is converted into a digital value.

As a result of electromagnetic compatibility interferences (for example, so-called spikes), the generated digital desired signal may be falsified. In an advantageous embodiment of the invention, in two additional iterative steps burst n+9 and burst n+10) the digital desired signal is verified. In this case, in a first step, a definable signal value (for example, 10% of the typical maximum value) is subtracted from the obtained digital desired signal (only if the digital desired signal previously had a correspondingly high value). When the present actual signal (at the preselected pulse) is compared with the desired signal (reduced by the difference) the former must exceed the latter. If not, the obtained desired value for this cycle is rejected. The corresponding result is recorded in a status bit. In the last step (burst n+10), a definable signal value (for example, 10% of the typical maximum value) is added beforehand to the desired signal, if the value is lower than the maximum value. When comparing the present actual signal (at the reference pulse) with the desired signal (reduced by the difference), a falling-short has to occur. If not, the obtained desired value for this cycle is rejected. The corresponding result is recorded in a status bit.

The thus obtained desired values including the evaluation by status bits are transmitted by way of an existing bus system from the test object to an external testing computer. Depending on the requirements and data which originate from other sources (for example, a Peak Power Meter), the testing computer computes individual desired values as operating thresholds. The values of those operating thresholds are finally programmed in the EPROMS of the test object.

During the operation, the respective comparator monitors the detected pulse power with respect to a reference value which was previously loaded from the corresponding EPROM into the input register of the DA converter in the comparator.

Figure 1:
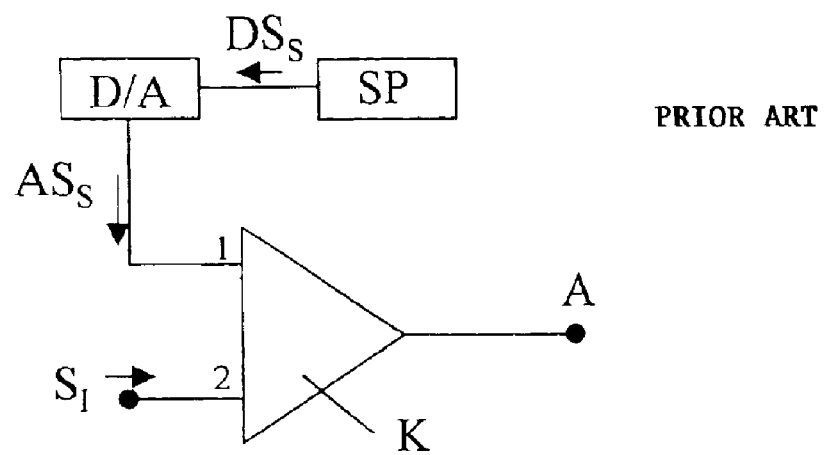
FIG. 1 shows a known circuit for converting an analog actual signal to a digital desired signal.
Figure 2:
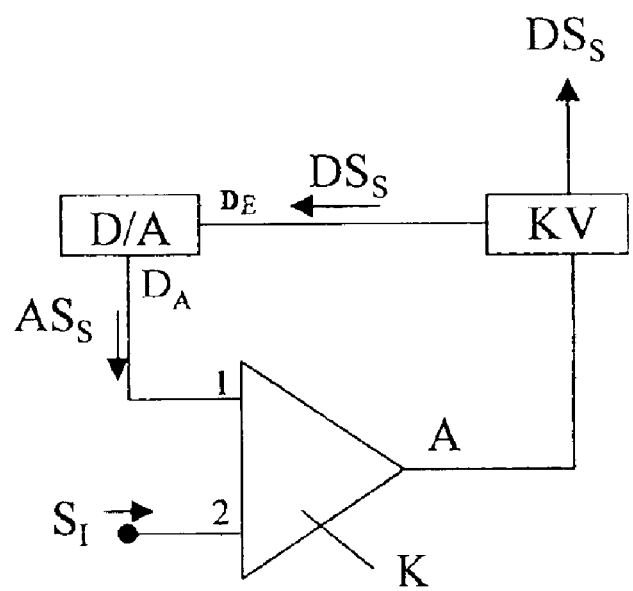
FIG. 2 shows an embodiment of a circuit for implementing the method according to the invention.

FIG. 2 shows an example of a circuit for implementing the method according to the invention. The circuit comprises a comparator K with two input ports 1, 2 and one output port A as well as a digital-to-analog converter D/A with one digital input port $D_E$ and one analog output port $D_A$. The analog output port $D_A$ is connected with an input port 1 of the comparator K. The analog actual signal $I_S$ to be adapted is fed to the other input port 2 of the comparator K. The output port A of the comparator K is connected with an electronic component KV for generating a digital desired signal $DS_S$, which is fed to the digital input port $D_E$ of the digital-to-analog converter D/A. In this case, the electronic component KV is constructed such that it generates the digital desired signal $DS_S$ according to the balancing method.

The digital desired signal $DS_S$ generated by the electronic component KV can also be fed to additional components (not shown) for a further processing.

The circuit illustrated in FIG. 2 permits, for example, the generation of a threshold value for a certain operating mode in the calibrating mode for an RF detector of an RF apparatus.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of converting an analog actual signal to a digital desired signal using a circuit that includes a comparator having first and second input ports and one output port and a digital-to-analog converter, said method comprising:

feeding the analog actual signal to said second input port of the comparator;

feeding an analog output signal of the digital-to-analog converter to said first input port of the comparator;

feeding the digital desired signal as a digital input signal to the digital-to-analog converter; and adapting the digital input signal fed to the digital-to-analog converter as a function of an output signal of the comparator, in a definable number of iterative steps, between definable lower and upper thresholds according to a balancing process, the digital input signal in each case fed to the digital-to-analog converter corresponding to the digital desired signal to which the analog actual signal is converted; wherein, the analog actual signal comprises a burst that includes a definable number of pulses;

said step of feeding said analog actual signal comprises feeding a preselected pulse, from a preselected position within the burst, to the second input port of the comparator; and based on the preselected pulse, in the comparator, a signal value is processed which corresponds to a pulse center thereof.

2. The method according to claim 1 wherein the number of the definable iterative steps corresponds to a bit length by which the digital desired signal is expressed.

3. A method of converting an analog actual signal to a digital desired signal using a circuit that includes a comparator having first and second input ports and one output port and a digital-to-analog converter, said method comprising:

feeding the analog actual signal to said second input port of the comparator;

feeding an analog output signal of the digital-to-analog converter to said first input port of the comparator;

feeding the digital desired signal as a digital input signal to the digital-to-analog converter; and adapting the digital input signal fed to the digital-to-analog converter as a function of an output signal of the comparator, in a definable number of iterative steps, between definable lower and upper thresholds according to a balancing process, the digital input signal in each case fed to the digital-to-analog converter corresponding to the digital desired signal to which the analog actual signal is converted;

wherein the digital desired signal is verified by a procedure in which, for a first additional iterative step, a definable signal value is subtracted from the analog actual signal forming a diminished actual signal;

the diminished actual signal is then fed to said second input port of the comparator;

the output signal of the comparator is checked to determine whether it falls below the analog output signal of the digital-to-analog converter, which is present at the first input port of the comparator and is generated from the digital desired signal to be verified; and for a second additional iterative step, a corresponding definable signal value is added to the analog actual signal forming an augmented actual signal;

the augmented actual signal is then fed to said second input port of the comparator;

the output signal of the comparator is checked to determine whether it exceeds the analog output signal of the digital-to-analog converter, which is present at the first input port of the comparator and is generated from the digital desired signal to be verified; and the digital desired signal is assumed to be correct when a result of the testing steps in the first and second additional iterative steps is affirmative.

4. A circuit for converting an analog actual signal to a desired digital signal, said circuit comprising:

a comparator having first and second analog input ports and one analog output port; and a digital-to-analog converter having one digital input port and one analog output port; wherein, the analog output port of the digital-to-analog converter is connected with the first input port of the comparator;

the analog actual signal is fed to the second input port of the comparator; and the analog output port of the comparator is connected with an electronic component for generating the desired digital signal which is fed to the digital input port of the digital-to-analog converter; wherein, the analog actual signal comprises a burst that includes a definable number of pulses;

said step of feeding said analog actual signal comprises feeding a preselected pulse, from a preselected position within the burst to the second input port of the comparator; and based on the preselected pulse, in the comparator, a signal value is processed which corresponds to a pulse center thereof.

* * * * *